US010903154B2

(12) United States Patent
Carney et al.

(10) Patent No.: US 10,903,154 B2
(45) Date of Patent: Jan. 26, 2021

(54) SEMICONDUCTOR DEVICE AND METHOD OF FORMING CANTILEVERED PROTRUSION ON A SEMICONDUCTOR DIE

(71) Applicant: SEMICONDUCTOR COMPONENTS INDUSTRIES, LLC, Phoenix, AZ (US)

(72) Inventors: Francis J. Carney, Mesa, AZ (US); Michael J. Seddon, Gilbert, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/545,164

(22) Filed: Aug. 20, 2019

(65) Prior Publication Data

US 2019/0378788 A1    Dec. 12, 2019

Related U.S. Application Data

(63) Continuation of application No. 15/903,704, filed on Feb. 23, 2018, now Pat. No. 10,453,784, which is a
(Continued)

(51) Int. Cl.
*H01L 23/495* (2006.01)
*H01L 23/498* (2006.01)
(Continued)

(52) U.S. Cl.
CPC .. *H01L 23/49827* (2013.01); *H01L 21/02035* (2013.01); *H01L 21/288* (2013.01);
(Continued)

(58) Field of Classification Search
CPC ......... H01L 23/49827; H01L 21/02035; H01L 21/288; H01L 21/304; H01L 21/3065; H01L 21/308; H01L 21/3083; H01L 21/4825; H01L 21/4853; H01L 21/486; H01L 21/565; H01L 21/67069; H01L 21/6835; H01L 21/76877; H01L 21/76898;
(Continued)

(56) References Cited

U.S. PATENT DOCUMENTS

2004/0041251 A1   3/2004 Goller et al.
2006/0284301 A1   12/2006 Corisis
(Continued)

*Primary Examiner* — Victor A Mandala
*Assistant Examiner* — Colleen E Snow
(74) *Attorney, Agent, or Firm* — Adam R. Stephenson, Ltd.

(57) ABSTRACT

A semiconductor device has a first semiconductor die with a base material. A covering layer is formed over a surface of the base material. The covering layer can be made of an insulating material or metal. A trench is formed in the surface of the base material. The covering layer extends into the trench to provide the cantilevered protrusion of the covering layer. A portion of the base material is removed by plasma etching to form a cantilevered protrusion extending beyond an edge of the base material. The cantilevered protrusion can be formed by removing the base material to the covering layer, or the cantilevered protrusion can be formed within the base material under the covering layer. A second semiconductor die is disposed partially under the cantilevered protrusion. An interconnect structure is formed between the cantilevered protrusion and second semiconductor die.

20 Claims, 9 Drawing Sheets

Related U.S. Application Data continuation of application No. 15/231,025, filed on Aug. 8, 2016, now Pat. No. 9,935,045.

(60) Provisional application No. 62/219,666, filed on Sep. 17, 2015.

(51) Int. Cl.

| | | |
|---|---|---|
| *H01L 21/48* | (2006.01) | |
| *H01L 23/00* | (2006.01) | |
| *H01L 21/3065* | (2006.01) | |
| *H01L 21/78* | (2006.01) | |
| *H01L 21/67* | (2006.01) | |
| *H01L 21/66* | (2006.01) | |
| *H01L 21/56* | (2006.01) | |
| *H01L 23/31* | (2006.01) | |
| *H02M 3/158* | (2006.01) | |
| *H01L 23/482* | (2006.01) | |
| *H01L 25/065* | (2006.01) | |
| *H01L 25/00* | (2006.01) | |
| *H01L 23/544* | (2006.01) | |
| *H01L 21/02* | (2006.01) | |
| *H01L 21/304* | (2006.01) | |
| *H01L 21/308* | (2006.01) | |
| *H01L 27/146* | (2006.01) | |
| *H01L 21/288* | (2006.01) | |
| *H01L 21/683* | (2006.01) | |
| *H01L 21/768* | (2006.01) | |
| *H01L 23/48* | (2006.01) | |
| *H01L 27/02* | (2006.01) | |
| *H01L 27/088* | (2006.01) | |
| *H01L 27/14* | (2006.01) | |
| *H01L 29/08* | (2006.01) | |
| H01L 23/15 | (2006.01) | |
| H01L 23/367 | (2006.01) | |
| H01L 23/14 | (2006.01) | |

(52) U.S. Cl.
CPC .......... *H01L 21/304* (2013.01); *H01L 21/308* (2013.01); *H01L 21/3065* (2013.01); *H01L 21/3083* (2013.01); *H01L 21/486* (2013.01); *H01L 21/4825* (2013.01); *H01L 21/4853* (2013.01); *H01L 21/565* (2013.01); *H01L 21/67069* (2013.01); *H01L 21/6835* (2013.01); *H01L 21/76877* (2013.01); *H01L 21/76898* (2013.01); *H01L 21/78* (2013.01); *H01L 22/12* (2013.01); *H01L 22/26* (2013.01); *H01L 23/3107* (2013.01); *H01L 23/3114* (2013.01); *H01L 23/481* (2013.01); *H01L 23/4822* (2013.01); *H01L 23/4951* (2013.01); *H01L 23/49503* (2013.01); *H01L 23/49541* (2013.01); *H01L 23/49562* (2013.01); *H01L 23/49575* (2013.01); *H01L 23/49811* (2013.01); *H01L 23/49838* (2013.01); *H01L 23/49866* (2013.01); *H01L 23/544* (2013.01); *H01L 23/562* (2013.01); *H01L 24/00* (2013.01); *H01L 24/05* (2013.01); *H01L 25/0655* (2013.01); *H01L 25/0657* (2013.01); *H01L 25/50* (2013.01); *H01L 27/0207* (2013.01); *H01L 27/088* (2013.01); *H01L 27/14* (2013.01); *H01L 27/14683* (2013.01); *H01L 29/0847* (2013.01); *H02M 3/158* (2013.01); *H01L 23/147* (2013.01); *H01L 23/15* (2013.01); *H01L 23/3677* (2013.01); *H01L 23/49816* (2013.01); *H01L 27/14625* (2013.01); *H01L 27/14685* (2013.01); *H01L 2221/68327* (2013.01); *H01L 2223/5446* (2013.01); *H01L 2223/54426* (2013.01); *H01L 2224/0401* (2013.01); *H01L 2224/04042* (2013.01); *H01L 2224/05083* (2013.01); *H01L 2224/05084* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05171* (2013.01); *H01L 2224/05172* (2013.01); *H01L 2224/05184* (2013.01); *H01L 2224/13025* (2013.01); *H01L 2224/13111* (2013.01); *H01L 2224/13116* (2013.01); *H01L 2225/06555* (2013.01); *H01L 2225/06593* (2013.01); *H01L 2225/06596* (2013.01); *H01L 2924/13055* (2013.01); *H01L 2924/13091* (2013.01); *H01L 2924/3511* (2013.01)

(58) Field of Classification Search
CPC ......... H01L 21/78; H01L 22/12; H01L 22/26; H01L 23/3107; H01L 23/3114; H01L 23/481; H01L 23/4822; H01L 23/49503; H01L 23/4951; H01L 23/49541; H01L 23/49562; H01L 23/49575; H01L 23/49811; H01L 23/49838; H01L 23/544; H01L 23/562
See application file for complete search history.

(56) References Cited

U.S. PATENT DOCUMENTS

| | | |
|---|---|---|
| 2008/0283906 A1 | 11/2008 | Bohr |
| 2012/0152449 A1 | 6/2012 | Watanabe et al. |
| 2012/0153449 A1 | 6/2012 | Chou |
| 2015/0118770 A1 | 4/2015 | Krabe et al. |
| 2016/0190072 A1 | 6/2016 | Talledo et al. |
| 2017/0092602 A1 | 3/2017 | Meyers et al. |
| 2017/0148719 A1 | 5/2017 | Asano |

SEMICONDUCTOR DEVICE AND METHOD OF FORMING CANTILEVERED PROTRUSION ON A SEMICONDUCTOR DIE

CLAIM TO DOMESTIC PRIORITY

The present application is a continuation of U.S. patent application Ser. No. 15/903,704, filed Feb. 23, 2018, now pending, which is a continuation of U.S. patent application Ser. No. 15/231,025, filed Aug. 8, 2016, now U.S. Pat. No. 9,935,045, issued Apr. 3, 2018, which claims the benefit of U.S. Provisional Application No. 62/219,666, filed Sep. 17, 2015, which applications are incorporated herein by reference.

FIELD OF THE INVENTION

The present invention relates in general to semiconductor devices and, more particularly, to a semiconductor device and method of forming a cantilevered protrusion on a semiconductor die.

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontrollers, application specific integrated circuits (ASIC), power conversion, standard logic, amplifiers, clock management, memory, interface circuits, and other signal processing circuits.

A need exists in the semiconductor industry for smaller and thinner package size so that the end products, such as cell phones, computers, and watches, can be reduced in size and weight. Semiconductor die typically mounted to a leadframe or substrate, such as shown in FIG. 1. Semiconductor die 50 has an active surface 52 and back surface 54. A metal layer 56 is formed over back surface 54. Semiconductor die 50 is mounted metal layer 56 to leadframe 60 with a solder fillet or conductive epoxy 62. The solder fillet or conductive epoxy 62 typically flows up side surfaces 58 of semiconductor die 50 to form a good bond. As semiconductor die 50 become thinner and smaller, solder fillet or conductive epoxy 62 may wick-up side surfaces 58 too far and possibly migrate onto active surface 52. Solder fillet or conductive epoxy 62 on active surface 52 can create manufacturing issues, such as short circuits and leakage.

The potential for wicking solder fillet or conductive epoxy 62 too far on side surfaces 58 and onto active surface 52 limits how thin semiconductor die 50 can be made and still avoid such conditions. The thinner semiconductor die 50 is more susceptible since the active area is closer to the wicking of the solder fillet or conductive epoxy 62. On the other hand, making solder fillet or conductive epoxy 62 thinner to accommodate the thinner semiconductor die 50 reduces the strength of the interconnect. In addition, the smaller semiconductor die is more difficult to handle and therefore are more susceptible to rotating off of the horizontal access and bringing the solder or epoxy closer to active surface 52.

In FIG. 2, flipchip semiconductor die 70 has an active surface 72 with interconnect pads 74 and back surface 76. Semiconductor die 70 is positioned over substrate 80 with interconnect pads 74 oriented toward the substrate. A solder 82 is formed between interconnect pads 74 and conductive traces 84 on substrate 80 to provide electrical interconnect. Solder fillet 82 may wick-up side surfaces 86 of semiconductor die 70 and encroach on active surface 72. Solder fillet 82 wicking too far on side surfaces 76 or onto active surface 72 can create manufacturing issues, such as short circuits and leakage.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer may contain active and passive electrical components and optical devices, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions. The optical device detects and records an image by converting the variable attenuation of light waves or electromagnetic radiation into electric signals.

Back-end manufacturing refers to cutting or singulating the finished wafer into the individual semiconductor die and packaging the semiconductor die for structural support, electrical interconnect, and environmental isolation. The wafer is singulated using plasma etching, laser cutting tool, or saw blade along non-functional regions of the wafer called saw streets or scribes. After singulation, the individual semiconductor die are mounted to a package substrate that includes pins or interconnect pads for interconnection with other system components. Interconnect pads formed over the semiconductor die are then connected to interconnect pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
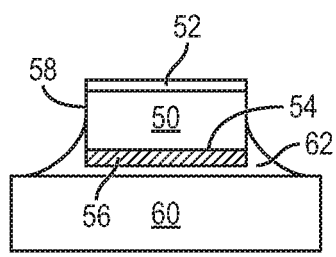
FIG. 1 illustrates a common mounting arrangement between a semiconductor die and leadframe.
Figure 2:
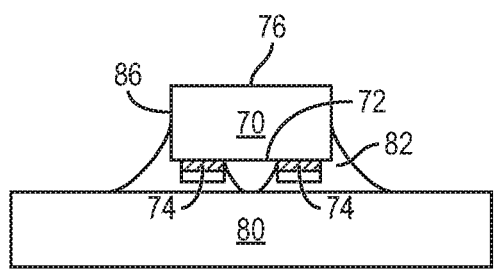
FIG. 2 illustrates another common mounting arrangement between a flipchip semiconductor die and substrate.
Figure 3A:
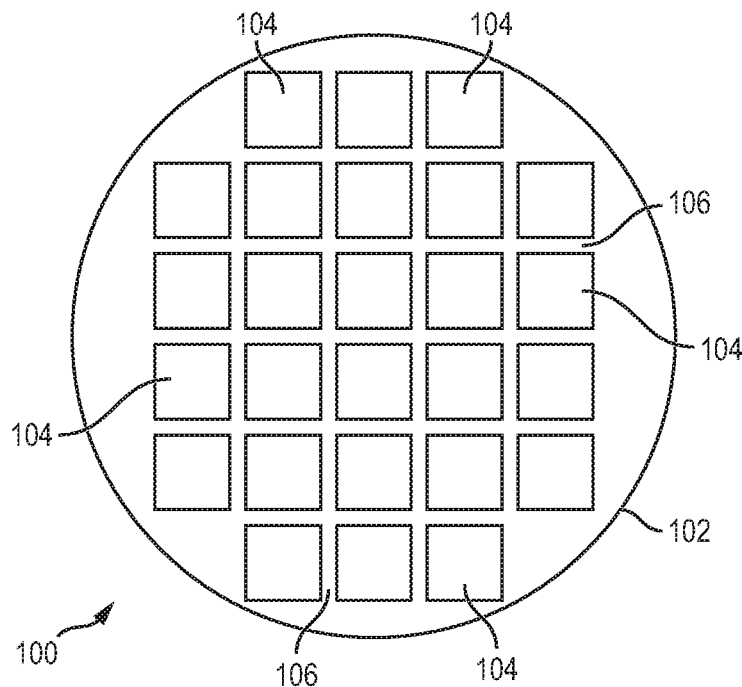
FIGS. 3a-3c illustrate a semiconductor wafer with a plurality of semiconductor die separated by a saw street.

FIG. 3a shows semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die 104 is formed on wafer 100 separated by non-active saw street 106, as described above. Saw street 106 provides singulation areas to singulate semiconductor wafer 100 into individual semiconductor die 104. In one embodiment, semiconductor wafer 100 has a width or diameter of 100-450 millimeters (mm) and thickness of 15-100 micrometers (μm).

Figure 3B:
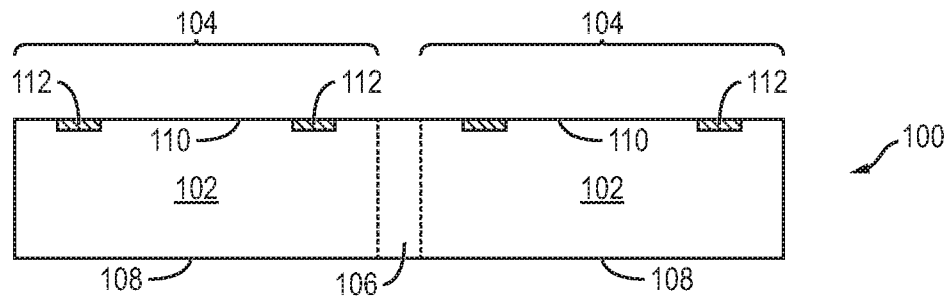

FIG. 3b shows a cross-sectional view of a portion of semiconductor wafer 100. Each semiconductor die 104 has a back surface 108 and an active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface or region 110 to implement analog circuits or digital circuits, such as digital signal processor (DSP), microcontrollers, ASIC, power conversion, standard logic, amplifiers, clock management, memory, interface circuits, and other signal processing circuit. Semiconductor die 104 may also contain integrated passive devices (IPDs), such as inductors, capacitors, and resistors, for RF signal processing. Active surface 110 may contain an image sensor area implemented as semiconductor charge-coupled devices (CCD) and active pixel sensors in complementary metal-oxide-semiconductor (CMOS) or N-type metal-oxide-semiconductor (NMOS) technologies. Semiconductor die 104 can be an optical lens, detector, vertical cavity surface emitting laser (VCSEL), waveguide, stacked die, electromagnetic (EM) filter, or multi-chip module. In one embodiment, semiconductor die 104 is a flipchip type semiconductor die.

An electrically conductive layer 112 is formed over active surface 110 using PVD, CVD, electrolytic plating, electroless plating process, evaporation, or other suitable metal deposition process. Conductive layer 112 includes one or more layers of aluminum (Al), copper (Cu), tin (Sn), nickel (Ni), gold (Au), silver (Ag), titanium (Ti), titanium tungsten (TiW), or other suitable electrically conductive material. Conductive layer 112 operates as interconnect pads electrically connected to the circuits on active surface 110.

Semiconductor wafer 100 undergoes electrical testing and inspection as part of a quality control process. Manual visual inspection and automated optical systems are used to perform inspections on semiconductor wafer 100. Software can be used in the automated optical analysis of semiconductor wafer 100. Visual inspection methods may employ equipment such as a scanning electron microscope, high-intensity or ultra-violet light, metallurgical microscope, or optical scope with 10×-500× magnification. Semiconductor wafer 100 is inspected for structural characteristics including warpage, thickness variation, surface particulates, irregularities, cracks, delamination, contamination, and discoloration.

Figure 3C:
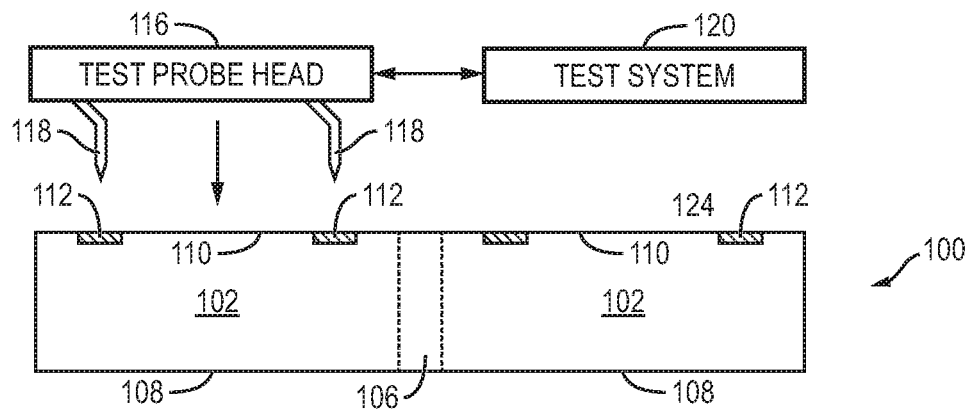

The active and passive components within semiconductor die 104 undergo testing at the wafer level for electrical performance and circuit function. Each semiconductor die 104 is tested for functionality and electrical parameters, as shown in FIG. 3c, using a test probe head 116 including a plurality of probes or test leads 118, or other testing device. Probes 118 are used to make electrical contact with nodes or conductive layer 112 on each semiconductor die 104 and provide electrical stimuli to interconnect pads 112. Semiconductor die 104 responds to the electrical stimuli, which is measured by computer test system 120 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 100 enables semiconductor die 104 that pass to be designated as known good die for use in a semiconductor package.

Figure 4A:
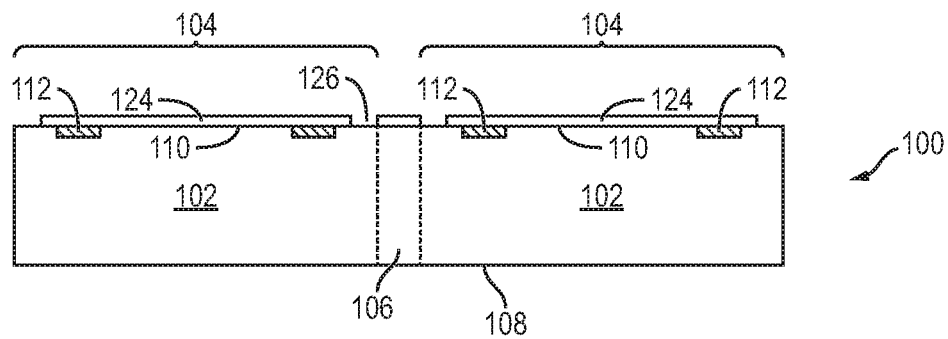
FIGS. 4a-4e illustrate a process of forming a cantilevered protrusion on the semiconductor die.

FIGS. 4a-4e illustrate a process of forming a cantilevered protrusion extending beyond active surface 110 of semiconductor die 104. In FIG. 4a, masking layer 124 is formed over active surface or region 110 and conductive layer 112 of each semiconductor die 104 while in the wafer form of FIG. 3a. Masking layer 124 can be made with photoresist or patterned oxide layer having openings 126.

Figure 4B:
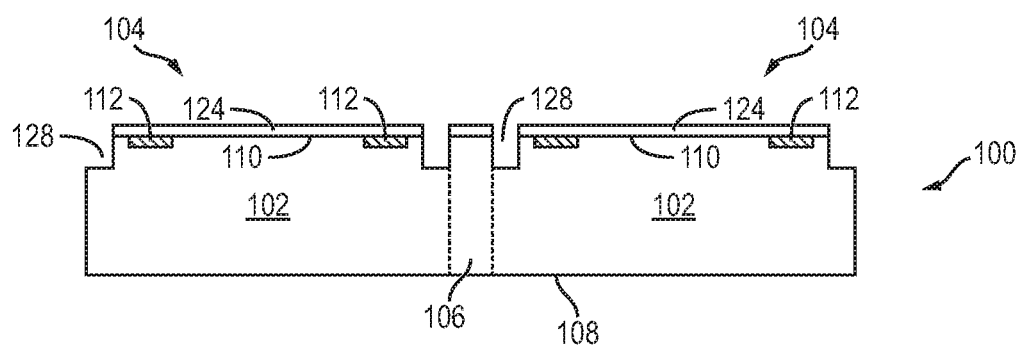

In FIG. 4b, a plasma etching process is applied through openings 126 in masking layer 124 to remove a portion of base substrate material 102 of each semiconductor die 104 and form trenches 128 extending partially into base substrate material 102 but not completely through the base substrate material. In one embedment, trench 128 has a width of 2-5 μm and depth of 5-10 μm into base substrate material 102. Plasma etching has advantages of removing base substrate 102 to form precision surfaces, while retaining the structure and integrity of the base substrate material. Alternatively, trenches 128 can be formed by laser direct ablation (LDA) or other wet or dry chemical etching process.

Figure 4C:
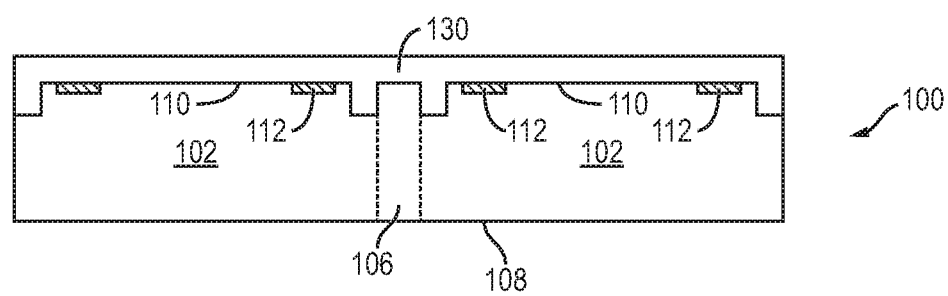

In FIG. 4c, masking layer 124 is removed and an insulating or passivation layer 130 is formed over active surface 110 and conductive layer 112 of semiconductor die 104 and into trenches 128 using PVD, CVD, printing, lamination, spin coating, spray coating, slit coating, or other coating process. The insulating layer 130 contains one or more layers of inorganic material such as silicon dioxide (SiO2), silicon nitride (Si3N4), silicon oxynitride (SiON), tantalum pentoxide (Ta2O5), aluminum oxide (Al2O3), or other material having similar insulating and structural properties. Alternatively, insulating layer 130 contains one or more layers of organic material such as polyimide, benzocyclobutene (BCB), polybenzoxazoles (PBO), or other material having similar insulating and structural properties. The insulating layer 130 has a thickness of about 2.0 μm to function as a covering layer. Alternatively, covering layer 130 can be metal.

Figure 4D:
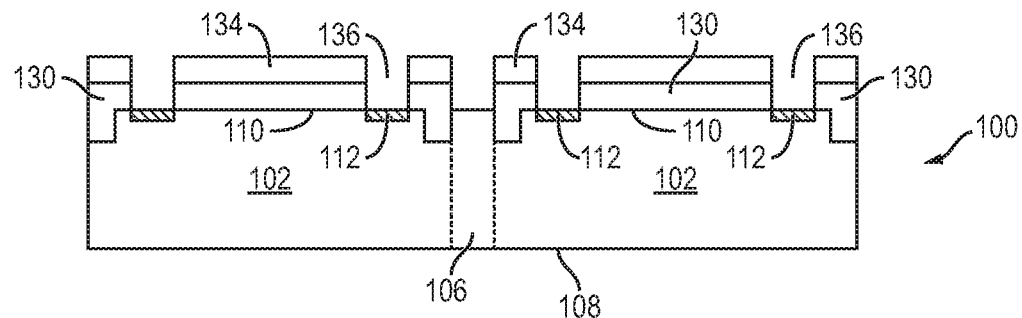

In FIG. 4d, masking layer 134 is formed over insulating layer 130. Masking layer 134 can be made with photoresist or patterned oxide layer having openings 136. A plasma etching process is applied through openings 136 in masking layer 134 to remove a portion of insulating layer 130 extending to conductive layer 112 and saw street 106. Plasma etching has advantages of forming precision surfaces on semiconductor die 104. Alternatively, the portion of insulating layer 130 extending to conductive layer 112 and saw street 106 can be removed by LDA or other wet or dry chemical etching process.

Figure 4E:
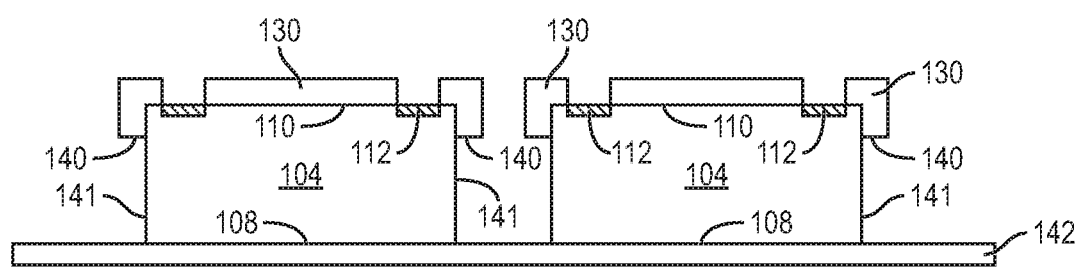

In FIG. 4e, semiconductor wafer 100 is mounted to film frame or backing tape 142. An isotropic etch removes a portion of base substrate material 102 under insulating layer 130 and singulates semiconductor die 104. Using insulating layer 130 as a mask, the isotropic etch undercuts the insulating layer to create cantilevered lip or protrusion 140 extending from side surface 141 of semiconductor die 104. Base substrate material 102 is removed up to insulating layer 130 so that cantilevered protrusion 140 is formed at what was the boundary between the base substrate material and insulating layer. The cantilevered protrusion 140 extends beyond the edge of base substrate material 102 by 5-10 μm.

Figure 5:
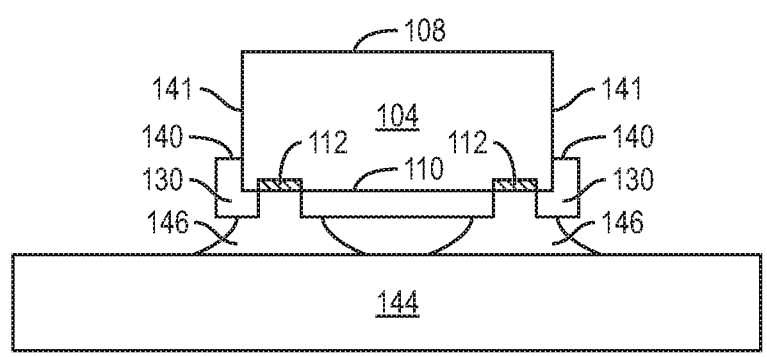
FIG. 5 illustrates the semiconductor die with the cantilevered protrusion mounted with the active surface oriented to a leadframe.

FIG. 5 shows semiconductor die 104 mounted to leadframe or substrate 144. For example, semiconductor die 104 is mounted to a die pad of leadframe 144 with insulating layer 130 oriented toward the leadframe. A conductive material 146 connects interconnect points on leadframe 144 to conductive layer 112. The cantilevered protrusion 140 prevents conductive material 146 from migrating onto side surface 141 and causing leakage or short circuit between active surface 110 and side surface 141, which may operate at a different potentials.

Figure 6:
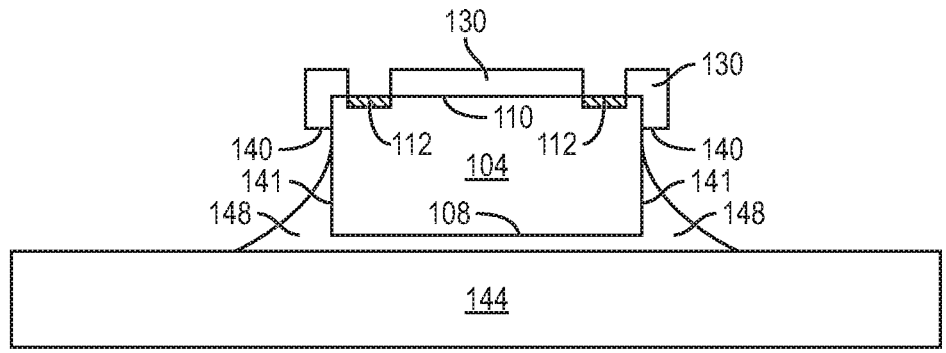
FIG. 6 illustrates the semiconductor die with the cantilevered protrusion mounted with the back surface oriented to a leadframe.

FIG. 6 shows another embodiment of semiconductor die 104 mounted to leadframe or substrate 144. In this case, semiconductor die 104 is mounted with back surface 108 oriented toward substrate 144. A conductive material 148, such as solder or conductive epoxy, is formed around semiconductor die 104. The cantilevered protrusion 140 of insulating layer 130 prevents conductive material 148 from wicking past the protrusion onto active surface 110 and causing leakage or short circuit defects. That is, cantilevered protrusion 140 blocks conductive material 148 from migrating onto active surface 110. By undercutting insulating layer 130 during singulation process to form cantilevered protrusion 140, semiconductor die 104 can be made a thinner die and/or smaller pitch die without the wicking defects and losing strength of the semiconductor package. The cantilevered protrusion 140 operates as a barrier to block migration of wicking conductive material 148 onto active surface 110.

Figure 7:
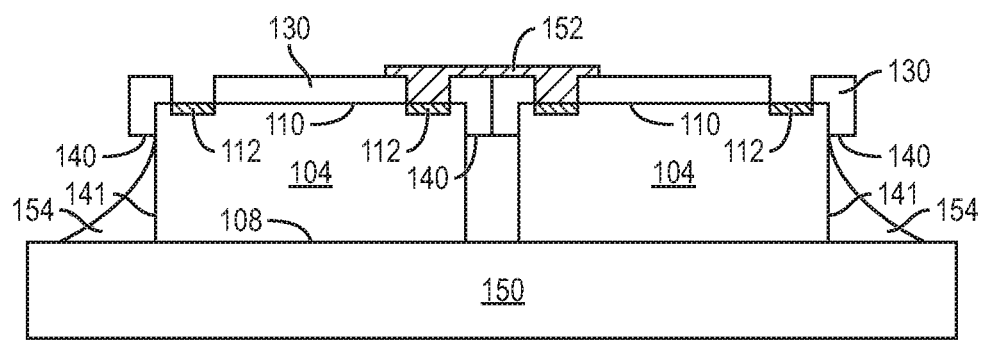
FIG. 7 illustrates side-by-side semiconductor die with the cantilevered protrusion mounted with the back surface oriented to a leadframe.

FIG. 7 shows another embodiment of semiconductor die 104a-104b mounted to leadframe or substrate 150. Semiconductor die 104a-104b are each mounted with back surface 108 oriented toward substrate 150. The cantilevered protrusion 140 of semiconductor die 104a is in direct physical contact with cantilevered protrusion 140 of semiconductor die 104b. Semiconductor die 104a-104b can be positioned side-by-side to reduce the semiconductor package size. An interconnect structure 152, such as a conductive layer, can be formed between conductive layer 112 of semiconductor die 104a and conductive layer 112 of semiconductor die 104b over the bridging cantilevered protrusions 140. The interconnect structure 152 provides an efficient electrical connection between semiconductor die 104a-104b, i.e. higher speed, lower inductance, less resistance, etc.

A conductive material 154, such as solder or conductive epoxy, is formed around semiconductor die 104a-104b. The cantilevered protrusion 140 of insulating layer 130 prevents conductive material 154 from wicking past the protrusion onto active surfaces 110 of semiconductor die 104a-104b and causing leakage or short circuit defects. That is, protrusion 140 blocks conductive material 154 from migrating onto active surfaces 110. By undercutting insulating layer 130 during singulation process to form cantilevered protrusion 140, semiconductor die 104a-104b can be made a thinner die and/or smaller pitch die without the wicking defects and losing strength of the semiconductor package. The cantilevered protrusion 140 operates as a barrier to block migration of wicking conductive material 154 onto active surfaces 110 of semiconductor die 104a-104b.

Figure 8A:
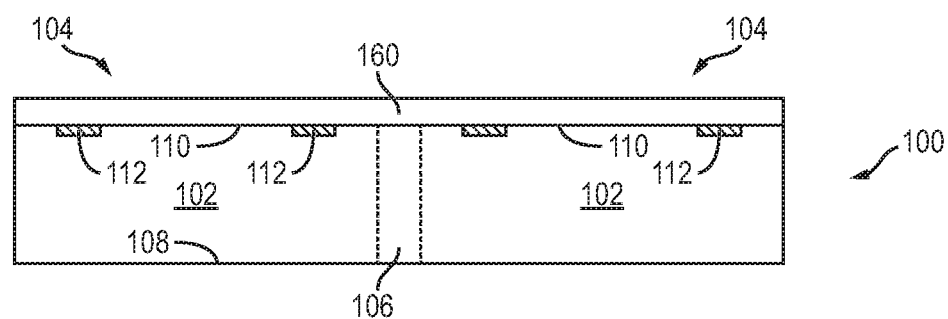
FIGS. 8a-8c illustrate another process of forming a cantilevered protrusion on the semiconductor die.
Figure 8B:
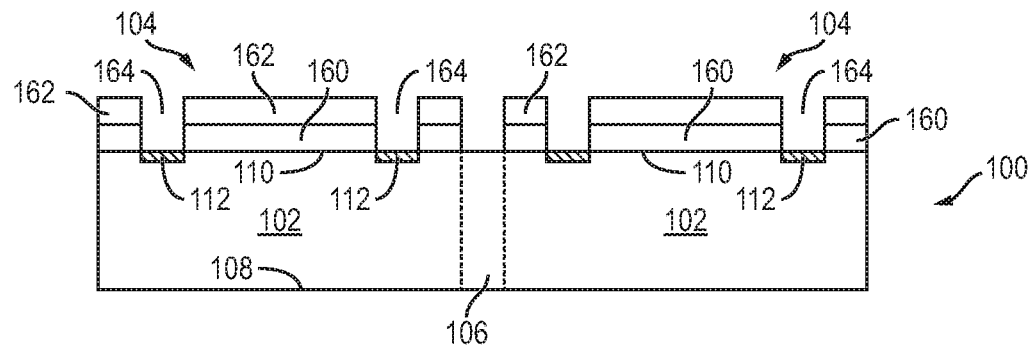
Figure 8C:
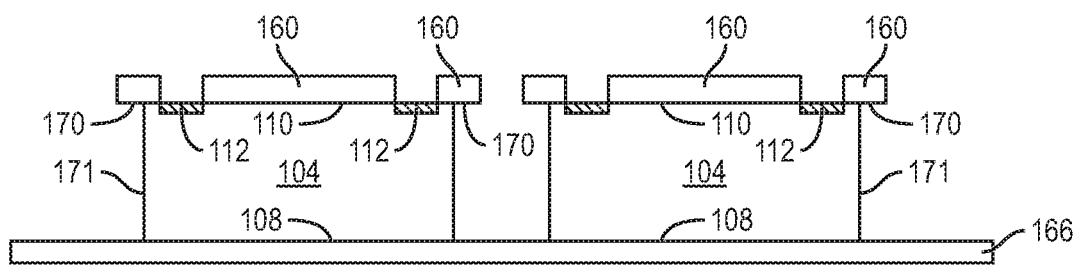

FIGS. 8a-8c illustrate another process of forming a cantilevered protrusion extending beyond active surface 110 of semiconductor die 104. Continuing from FIG. 3c, an insulating or passivation layer 160 is formed over active surface 110 and conductive layer 112 of semiconductor die 104 at the wafer level, using PVD, CVD, printing, lamination, spin coating, spray coating, slit coating, or other coating process. The insulating layer 160 contains one or more layers of insulating material such as SiO2, Si3N4, SiON, Ta2O5, Al2O3, polyimide, benzocyclobutene-based polymers, or other material having similar insulating and structural properties. Alternatively, insulating layer 160 contains one or more layers of organic material such as polyimide, BCB, PBO, or other material having similar insulating and structural properties. The insulating layer 160 has a thickness of about 2.0 μm to function as a covering layer. Alternatively, covering layer 160 can be metal.

In FIG. 8b, a masking layer 162 is formed over insulating layer 160. Masking layer 162 can be made with photoresist or patterned oxide layer having openings 164. A plasma etching process is applied through openings 164 in masking layer 162 to remove a portion of insulating layer 160 extending to conductive layer 112 and saw street 106. Plasma etching has advantages of forming precision surfaces on semiconductor die 104. Alternatively, the portion of insulating layer 160 extending to conductive layer 112 and saw street 106 can be removed by LDA or other wet or dry chemical etching process.

In FIG. 8c, semiconductor wafer 100 is mounted to film frame or backing tape 166. An isotropic etch removes a portion of base substrate material 102 under insulating layer 160 and singulates semiconductor die 104. Using insulating layer 160 as a mask, the isotropic etch undercuts the insulating layer to create cantilevered lip or protrusion 170 extending from side surface 171 of semiconductor die 104. Base substrate material 102 is removed up to insulating layer 160 so that cantilevered protrusion 170 is formed at what was the boundary between the base substrate material and insulating layer. The cantilevered protrusion 170 extends beyond the edge of base substrate material 102 by 5-10 μm.

Figure 9:
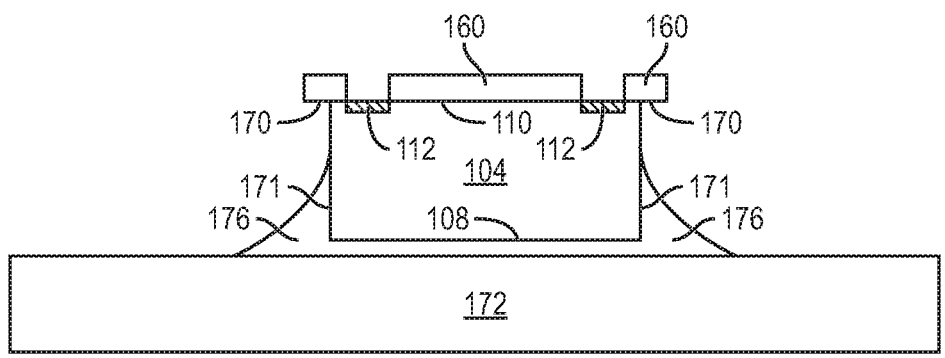
FIG. 9 illustrates the semiconductor die with the cantilevered protrusion mounted to a leadframe in accordance with FIGS. 8a-8c.

FIG. 9 shows semiconductor die 104 mounted to leadframe or substrate 172. For example, semiconductor die 104 is mounted with back surface 108 oriented toward substrate 172. A conductive material 176, such as solder or conductive epoxy, is formed around semiconductor die 104. The cantilevered protrusion 170 of insulating layer 160 prevents conductive material 176 from wicking past the protrusion onto active surface 110 and causing leakage or short circuit defects. That is, cantilevered protrusion 170 blocks conductive material 176 from migrating onto active surface 110. By undercutting insulating layer 160 during singulation process to form cantilevered protrusion 170, semiconductor die 104 can be made a thinner die and/or smaller pitch die without the wicking defects and losing strength of the semiconductor package. The cantilevered protrusion 170 operates as a barrier to block migration of wicking conductive material 176 onto active surface 110.

Figure 10A:
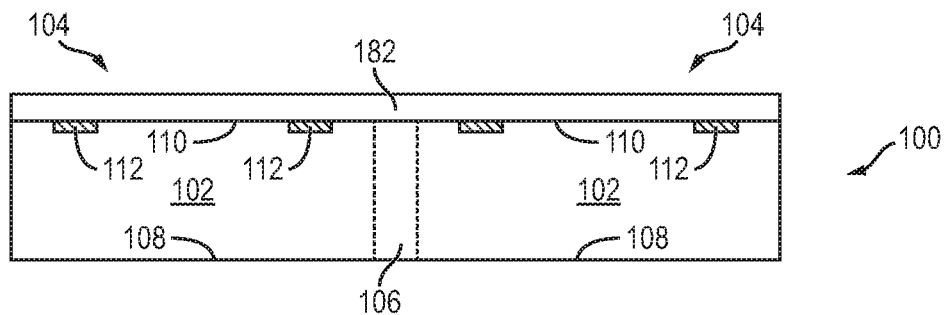
FIGS. 10a-10c illustrate another process of forming a cantilevered protrusion on the semiconductor die.
Figure 10B:
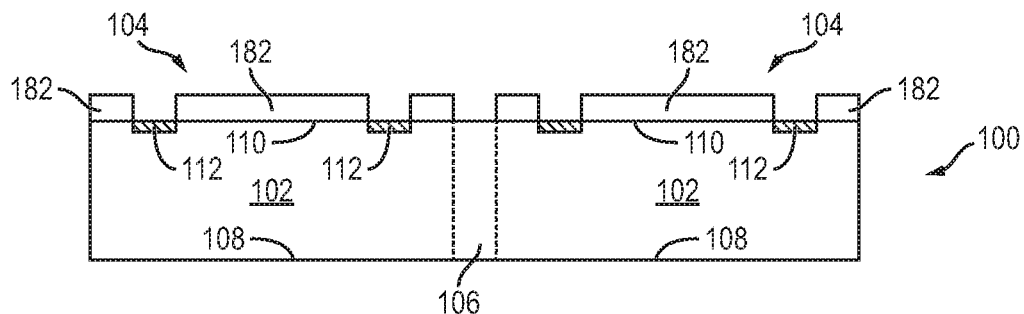
Figure 10C:
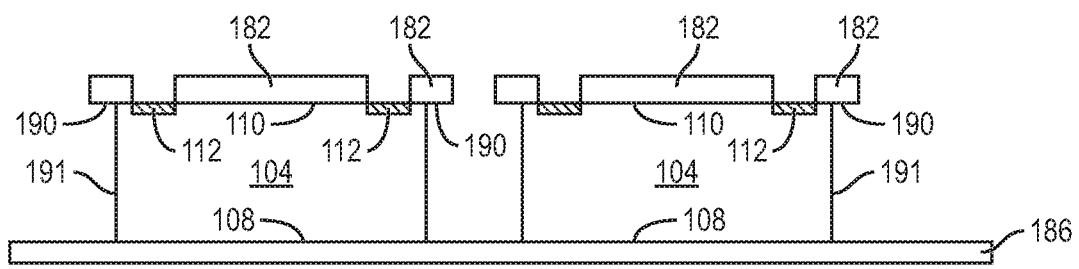

FIGS. 10a-10c illustrate another process of forming a cantilevered protrusion extending beyond active surface 110 of semiconductor die 104. Continuing from FIG. 3c, an insulating or passivation layer 182 is formed over active surface 110 and conductive layer 112 of semiconductor die 104 at the wafer level, using PVD, CVD, printing, lamination, spin coating, spray coating, slit coating, or other coating process. The insulating layer 182 contains one or more layers of inorganic material such as SiO2, Si3N4, SiON, Ta2O5, Al2O3, or other material having similar insulating and structural properties. Alternatively, insulating layer 182 contains one or more layers of organic material such as polyimide, BCB, PBO, or other material having similar insulating and structural properties. The insulating layer 182 has a thickness of about 2.0 μm to function as a covering layer. Alternatively, covering layer 182 can be metal.

In FIG. 10b, a portion of insulating layer 182 is removed extending to conductive layer 112 and saw street 106 using a plasma etching process. Plasma etching has advantages of forming precision surfaces on semiconductor die 104. Alternatively, the portion of insulating layer 160 extending to conductive layer 112 and saw street 106 can be removed by LDA or other wet or dry chemical etching process.

In FIG. 10c, semiconductor wafer 100 is mounted to film frame or backing tape 186. An isotropic etch removes a portion of base substrate material 102 under insulating layer 182 and singulates semiconductor die 104. Using insulating layer 182 as a mask, the isotropic etch undercuts the insulating layer to create cantilevered lip or protrusion 190 extending from side surface 191 of semiconductor die 104. Base substrate material 102 is removed up to insulating layer 182 so that cantilevered protrusion 190 is formed at what was the boundary between the base substrate material and insulating layer. The cantilevered protrusion 190 extends beyond the edge of base substrate material 102 by 5-10 μm.

Figure 11:
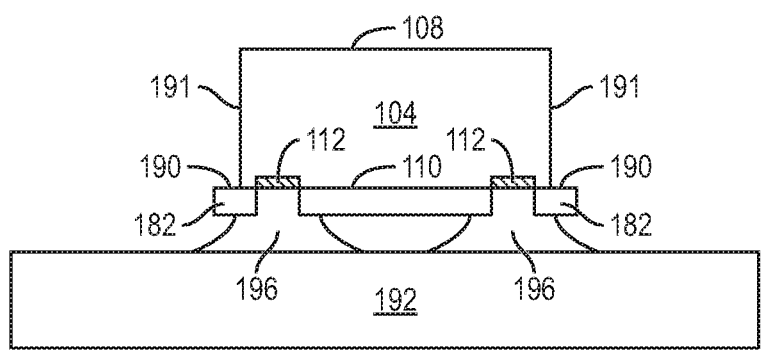
FIG. 11 illustrates the semiconductor die with the cantilevered protrusion mounted to a leadframe in accordance with FIGS. 10a-10c.

FIG. 11 shows semiconductor die 104 mounted to leadframe or substrate 192. For example, semiconductor die 104 is mounted with insulating layer 182 oriented toward substrate 192. A conductive material 196, such as solder or conductive epoxy, is formed around semiconductor die 104. The cantilevered protrusion 190 prevents conductive material 196 from migrating onto side surface 191 and causing leakage or short circuit defects between active surface 110 and side surface 191, which may operate at a different potentials.

Figure 12A:
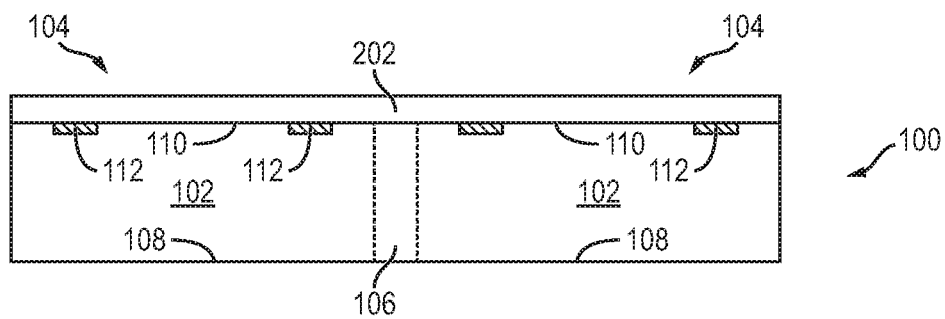
FIGS. 12a-12c illustrate another process of forming a cantilevered protrusion on the semiconductor die.
Figure 12B:
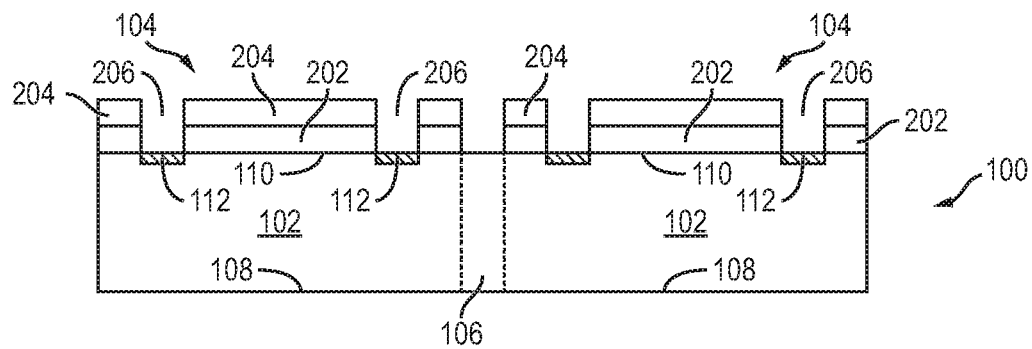
Figure 12C:
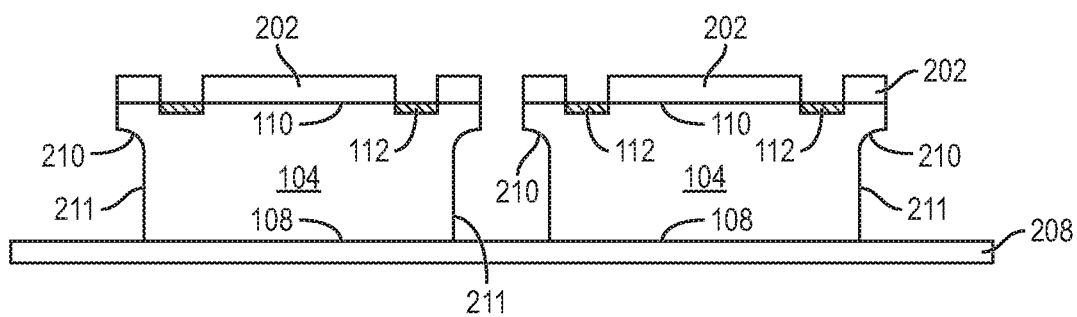

FIGS. 12a-12c illustrate another process of forming a cantilevered protrusion extending beyond active surface 110 of semiconductor die 104. Continuing from FIG. 3c, an insulating or passivation layer 202 is formed over active surface 110 and conductive layer 112 of semiconductor die 104 at the wafer level using PVD, CVD, printing, lamination, spin coating, spray coating, slit coating, or other coating process. The insulating layer 202 contains one or more layers of inorganic material such as SiO2, Si3N4, SiON, Ta2O5, Al2O3, or other material having similar insulating and structural properties. Alternatively, insulating layer 202 contains one or more layers of organic material such as polyimide, BCB, PBO, or other material having similar insulating and structural properties. The insulating layer 202 has a thickness of about 2.0 μm to function as a covering layer. Alternatively, covering layer 202 can be metal.

In FIG. 12b, a masking layer 204 is formed over insulating layer 202. Masking layer 204 can be made with photoresist or patterned oxide layer having openings 206. A plasma etching process is applied through openings 206 in masking layer 204 to remove a portion of insulating layer 202 extending to conductive layer 112 and saw street 106. Plasma etching has advantages of forming precision surfaces on semiconductor die 104. Alternatively, the portion of insulating layer 202 extending to conductive layer 112 and saw street 106 can be removed by LDA or other wet or dry chemical etching process.

In FIG. 12c, semiconductor wafer 100 is mounted to film frame or backing tape 208. A varying etch is used to remove a portion of base substrate material 102 under insulating layer 202 and singulate semiconductor die 104. In this case, removing the portion of base substrate material 102 under insulating layer 202 creates cantilevered lip or protrusion 210 in side surface 211 of the base substrate material. More specifically, alternating a plasma etch from a slower process, which produces straighter sidewalls, to a faster isotropic etch undercuts the previous structure to make cantilevered protrusion 210. A portion of base substrate material 102 remains between cantilevered protrusion 210 and insulating layer 202. Plasma etching has advantages of removing base substrate material 102 to form precision surfaces, while retaining the structure and integrity of the base substrate material.

Figure 13:
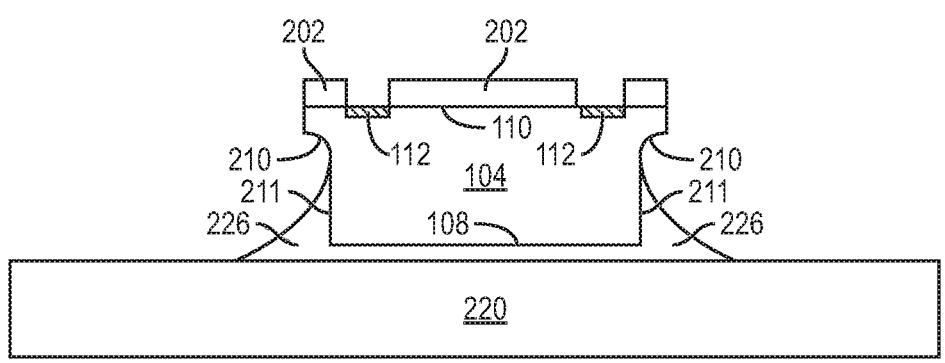
FIG. 13 illustrates the semiconductor die with the cantilevered protrusion mounted to a leadframe in accordance with FIGS. 12a-12c.

FIG. 13 shows semiconductor die 104 mounted to leadframe or substrate 220. For example, semiconductor die 104 is mounted with back surface 108 oriented toward substrate 220. A conductive material 226, such as solder or conductive epoxy, is formed around semiconductor die 104. The cantilevered protrusion 210 in base substrate material 102 prevents conductive material 226 from wicking past the protrusion onto active surface 110 and causing leakage or short circuit defects. That is, cantilevered protrusion 210 blocks conductive material 226 from migrating onto active surface 110. By forming cantilevered protrusion 210 in base substrate material 102 during singulation, semiconductor die 104 can be made a thinner die and/or smaller pitch die without the wicking defects and losing strength of the semiconductor package. The cantilevered protrusion 210 operates as a barrier to block migration of wicking conductive material 226 onto active surface 110.

Figure 14:
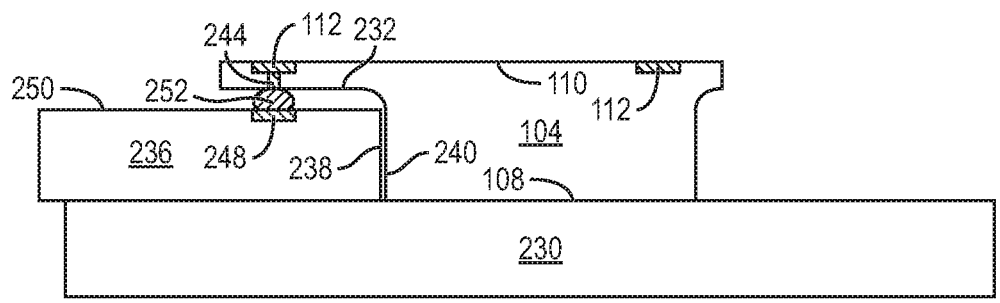
FIG. 14 illustrates partially stacked semiconductor die within a cantilevered protrusion.

FIG. 14 shows semiconductor die 104, similar to FIG. 12c, mounted to leadframe or substrate 230. For example, semiconductor die 104 is mounted with back surface 108 oriented toward substrate 230. In this case, cantilevered protrusion 232 in base substrate material 102 has a lateral depth of 50-150 μm. Semiconductor die 236 has a height less than the height of semiconductor die 104. Semiconductor die 236 is disposed over a second die pad of leadframe 230 partially within cantilevered protrusion 232. Side surface 238 of semiconductor die 236 can be in direct physical contact with side surface 240 of semiconductor die 104. A conductive via 244 extends from conductive layer 112 of semiconductor die 104 vertically through base substrate material 102. A bump 252 can be disposed between conductive via 244 (or the bottom of conductive layer 112) and conductive layer 248 of semiconductor die 236, which is connected to circuits on active surface 250, to make electrical connection between semiconductor die 104 and 236. Semiconductor die 104 and 236 provide a partially stacked die arrangement to reduce the semiconductor package size.

Figure 15:
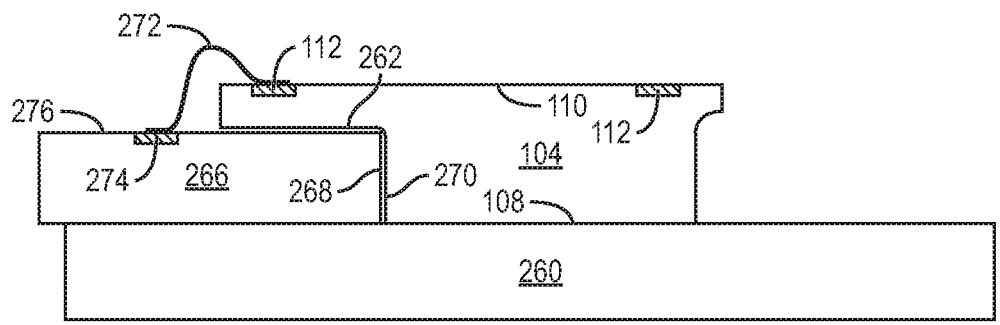
FIG. 15 illustrates another embodiment of partially stacked semiconductor die within a cantilevered protrusion and bond wire for electrical interconnect.

FIG. 15 shows semiconductor die 104, similar to FIG. 12c, mounted to leadframe or substrate 260. Substrate 260 could be a passive device, board interconnect, or optical fiber device. For example, semiconductor die 104 is mounted with back surface 108 oriented toward substrate 260. Substrate 260 could be a passive device, board interconnect or optical fiber device. In this case, cantilevered protrusion 262 in base substrate material 102 has a lateral depth of 50-150 μm. Semiconductor die 266 has a height less than the height of semiconductor die 104. Semiconductor die 266 is disposed over a second die pad of leadframe 260 partially within cantilevered protrusion 262. Side surface 268 of semiconductor die 236 can be in direct physical contact with or close proximity of side surface 270 of semiconductor die 104. A bond wire 272 extends from conductive layer 112 of semiconductor die 104 to conductive layer 274 of semiconductor die 266, which is connected to circuits on active surface 276. Semiconductor die 104 and 266 provide a partially stacked die arrangement to reduce the semiconductor package size.

Figure 16:
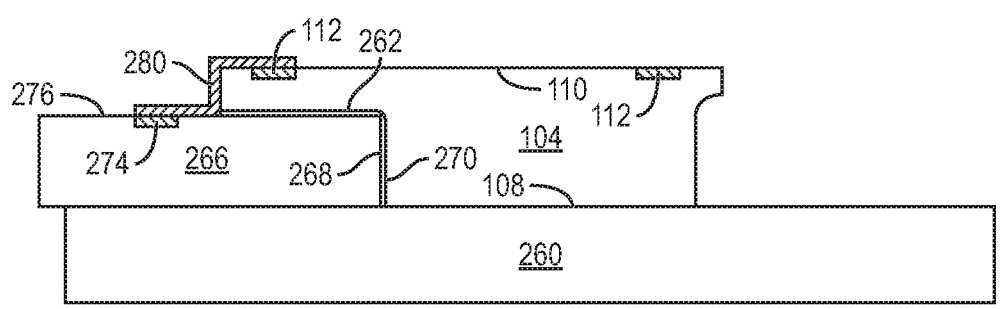
FIG. 16 illustrates an embodiment of partially stacked semiconductor die within a cantilevered protrusion and conductive trace following a side surface of the cantilevered protrusion for electrical interconnect.

FIG. 16 shows semiconductor die 104, similar to FIG. 15, mounted to leadframe or substrate 260. Substrate 260 could be a passive device, board interconnect, or optical fiber device. In this case, a conductive layer 280 is formed over and around a side surface of cantilevered protrusion 262 to electrically connect to circuits on active surface 276. Semiconductor die 104 and 266 provide a partially stacked die arrangement to reduce the semiconductor package size.

While one or more embodiments have been illustrated and described in detail, the skilled artisan will appreciate that modifications and adaptations to those embodiments may be made without departing from the scope of the present disclosure.

What is claimed:

1. A method of making a semiconductor device, comprising:
    providing a first semiconductor die;
    forming a covering layer over a surface of the first semiconductor die;
    forming a trench in a semiconductor material of the first semiconductor die; and
    forming the covering layer into the trench;
    wherein the covering layer extends outside the first semiconductor die to form a cantilevered protrusion of the first semiconductor die.

2. The method of claim 1, wherein the covering layer is made of an insulating material or metal.

3. The method of claim 1, wherein the cantilevered protrusion blocks material from migrating onto a side surface of the first semiconductor die.

4. The method of claim 1, further comprising removing a portion of the semiconductor material under the covering layer to form the cantilevered protrusion of the first semiconductor die.

5. The method of claim 1, further comprising forming the cantilevered protrusion to include a semiconductor material of the first semiconductor die.

6. The method of claim 1, further comprising disposing a second semiconductor die partially under the cantilevered protrusion.

7. A semiconductor device, comprising:
    a first semiconductor die;
    a covering layer defined by a shape of a trench formed in the first semiconductor die, the covering layer extending over a surface of the first semiconductor die protruding beyond the first semiconductor die to form a cantilevered protrusion of the first semiconductor die.

8. The semiconductor device of claim 7, wherein the covering layer is made of an insulating material or metal.

9. The semiconductor device of claim 7, further comprising a second semiconductor die disposed partially under the cantilevered protrusion.

10. The semiconductor device of claim 7, further comprising a material disposed over the surface of the first semiconductor die, wherein the cantilevered protrusion blocks the material from migrating onto a side surface of the first semiconductor die.

11. The semiconductor device of claim 7, further comprising a conductive layer formed over the covering layer.

12. The semiconductor device of claim 7, further comprising removing a portion of a semiconductor material under the covering layer to form the cantilevered protrusion of the first semiconductor die.

13. The semiconductor device of claim 7, wherein the cantilevered protrusion includes a semiconductor material of the first semiconductor die.

14. A semiconductor device, comprising:
    a first semiconductor die, wherein a portion of the first semiconductor die forms a cantilevered protrusion; and
    a material disposed over a surface of the first semiconductor die, wherein the cantilevered protrusion is configured to prevent the material from migrating onto a side surface of the first semiconductor die.

15. The semiconductor device of claim 14, further comprising a covering layer formed over the first semiconductor die.

16. The semiconductor device of claim 15, wherein the covering layer is made of an insulating material or metal.

17. The semiconductor device of claim 15, further comprising a conductive layer formed over the covering layer.

18. The semiconductor device of claim 15, wherein a portion of the cantilevered protrusion of the first semiconductor die is included in a trench formed in the first semiconductor die.

19. The semiconductor device of claim 14, further comprising a second semiconductor die disposed partially under the cantilevered protrusion.

20. The semiconductor device of claim 19, further comprising an electrical interconnect disposed between the first semiconductor die and the second semiconductor die.

* * * * *